US012672385B2

(12) United States Patent
Liu et al.

(10) Patent No.: US 12,672,385 B2
(45) Date of Patent: Jun. 30, 2026

(54) PASSIVATED CONTACT STRUCTURE AND PREPARATION METHOD THEREOF, AND SOLAR CELL AND PREPARATION METHOD THEREOF

(71) Applicant: TRINA SOLAR CO., LTD., Changzhou (CN)

(72) Inventors: Chengfa Liu, Changzhou (CN); Dongyun Lv, Changzhou (CN); Daming Chen, Changzhou (CN); Hong Chen, Changzhou (CN); Zigang Wang, Changzhou (CN); Wei Liu, Changzhou (CN)

(73) Assignee: TRINA SOLAR CO., LTD., Changzhou (CN)

( * ) Notice: Subject to any disclaimer, the term of this patent is extended or adjusted under 35 U.S.C. 154(b) by 0 days.

(21) Appl. No.: 18/757,244

(22) Filed: Jun. 27, 2024

(65) Prior Publication Data

US 2024/0347647 A1 Oct. 17, 2024

(30) Foreign Application Priority Data

Nov. 1, 2023 (CN) .......................... 202311443751.6

(51) Int. Cl.
*H10F 77/00* (2025.01)
*H10F 71/00* (2025.01)

(52) U.S. Cl.
CPC ......... *H10F 77/935* (2025.01); *H10F 71/128* (2025.01); *H10F 71/129* (2025.01)

(58) Field of Classification Search
CPC ...... H10F 10/14; H10F 71/121; H10F 71/182; H10F 71/129; H10F 77/211; H10F 77/311; H10F 77/935
See application file for complete search history.

(56) References Cited

U.S. PATENT DOCUMENTS

| | | | |
|---|---|---|---|
| 11,444,212 | B2 | 9/2022 | Chen et al. |
| 2016/0056322 | A1 | 2/2016 | Yang et al. |
| 2017/0005218 | A1 | 1/2017 | Chang et al. |

(Continued)

FOREIGN PATENT DOCUMENTS

| | | |
|---|---|---|
| CN | 112466996 A | 3/2021 |
| CN | 112582484 A | 3/2021 |

(Continued)

OTHER PUBLICATIONS

CN 115513306 A English Translation by FIT database, translated on May 19, 2025.*
European Search Report, European Patent Application No. 24178569.0, dated Dec. 2, 2024.
Examination Report, Australian Patent Application No. 2024203400, dated Jun. 6, 2024.
Second Examination Report, Australian Patent Application No. 2024203400, dated Sep. 19, 2024.

(Continued)

*Primary Examiner* — Golam Mowla
(74) *Attorney, Agent, or Firm* — MARSHALL, GERSTEIN & BORUN LLP

(57) ABSTRACT

A preparation method of a passivated contact structure includes: forming a tunneling layer on a semiconductor substrate; forming an intrinsic semiconductor layer on the tunneling layer; forming a doped layer containing a dopant on the intrinsic semiconductor layer, and performing an activation treatment on the doped layer to diffuse the dopant in the doped layer into the intrinsic semiconductor layer to form a doped semiconductor layer. The tunneling layer and the doped semiconductor layer form the passivated contact structure.

15 Claims, 4 Drawing Sheets

(56) References Cited

U.S. PATENT DOCUMENTS

| | | |
|---|---|---|
| 2022/0262967 A1 | 8/2022 | Kim et al. |
| 2023/0187564 A1 | 6/2023 | Jin et al. |

FOREIGN PATENT DOCUMENTS

| | | | |
|---|---|---|---|
| CN | 214753793 | U | 11/2021 |
| CN | 114883421 | A | 8/2022 |
| CN | 115498057 | A | 12/2022 |
| CN | 115513306 | A | 12/2022 |
| CN | 116722056 | A | 9/2023 |
| CN | 116798859 | A | 9/2023 |
| CN | 116936687 | A | 10/2023 |
| CN | 116978960 | A | 10/2023 |
| JP | 2016-92425 | A | 5/2016 |
| WO | WO-2022174421 | A1 | 8/2022 |
| WO | WO-2023124299 | A1 | 7/2023 |

OTHER PUBLICATIONS

Office Action, Chinese Patent Application No. 202311443751.6, dated Aug. 7, 2024.

Hsieh et al., "In Situ Plasma Monitoring of PECVD nc-Si:H Films and the Influence of Dilution Ratio on Structural Evolution", *Coatings*, 8(238),1-13, Jul. 6, 2018, 13 pages.

Soppe et al., "The effect of argon dilution on deposition of microcrystalline silicon by microwave plasma enhanced chemical vapor deposition", *Thin Solid Films*, 515(19), 7490-7494, Jan. 12, 2007, 5 pages.

Soppe et al., "Microwave PECVD of Micro-Crystalline Silicon", *ResearchGate*, Jun. 2-7, 2002, 6 pages.

Office Action, Japanese Patent Application No. 2024-087685, dated Jul. 8, 2025.

Office Action, Japanese Patent Application No. 2024-087685, dated Apr. 1, 2025.

* cited by examiner

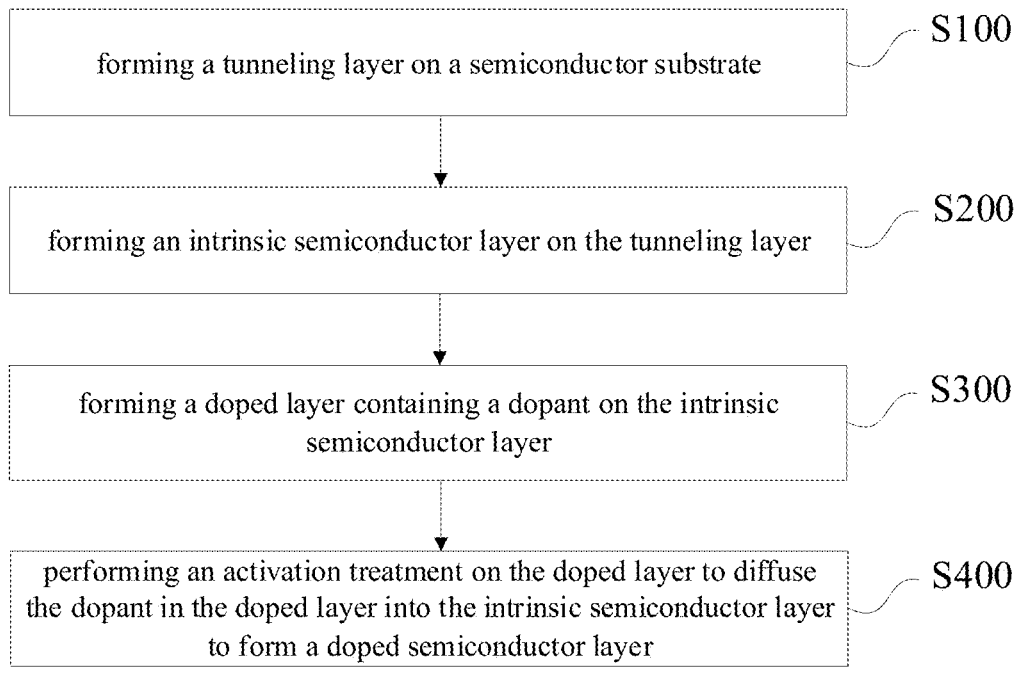

| forming a tunneling layer on a semiconductor substrate | S100 |

↓

| forming an intrinsic semiconductor layer on the tunneling layer | S200 |

↓

| forming a doped layer containing a dopant on the intrinsic semiconductor layer | S300 |

↓

| performing an activation treatment on the doped layer to diffuse the dopant in the doped layer into the intrinsic semiconductor layer to form a doped semiconductor layer | S400 |

FIG. 1

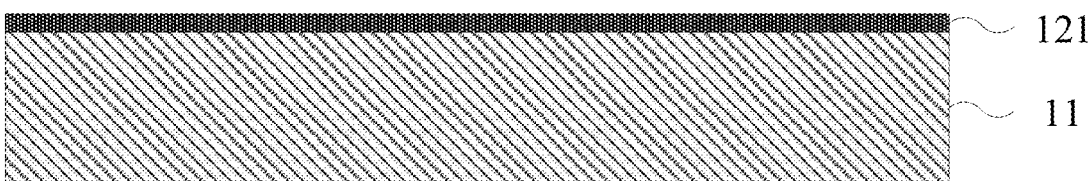

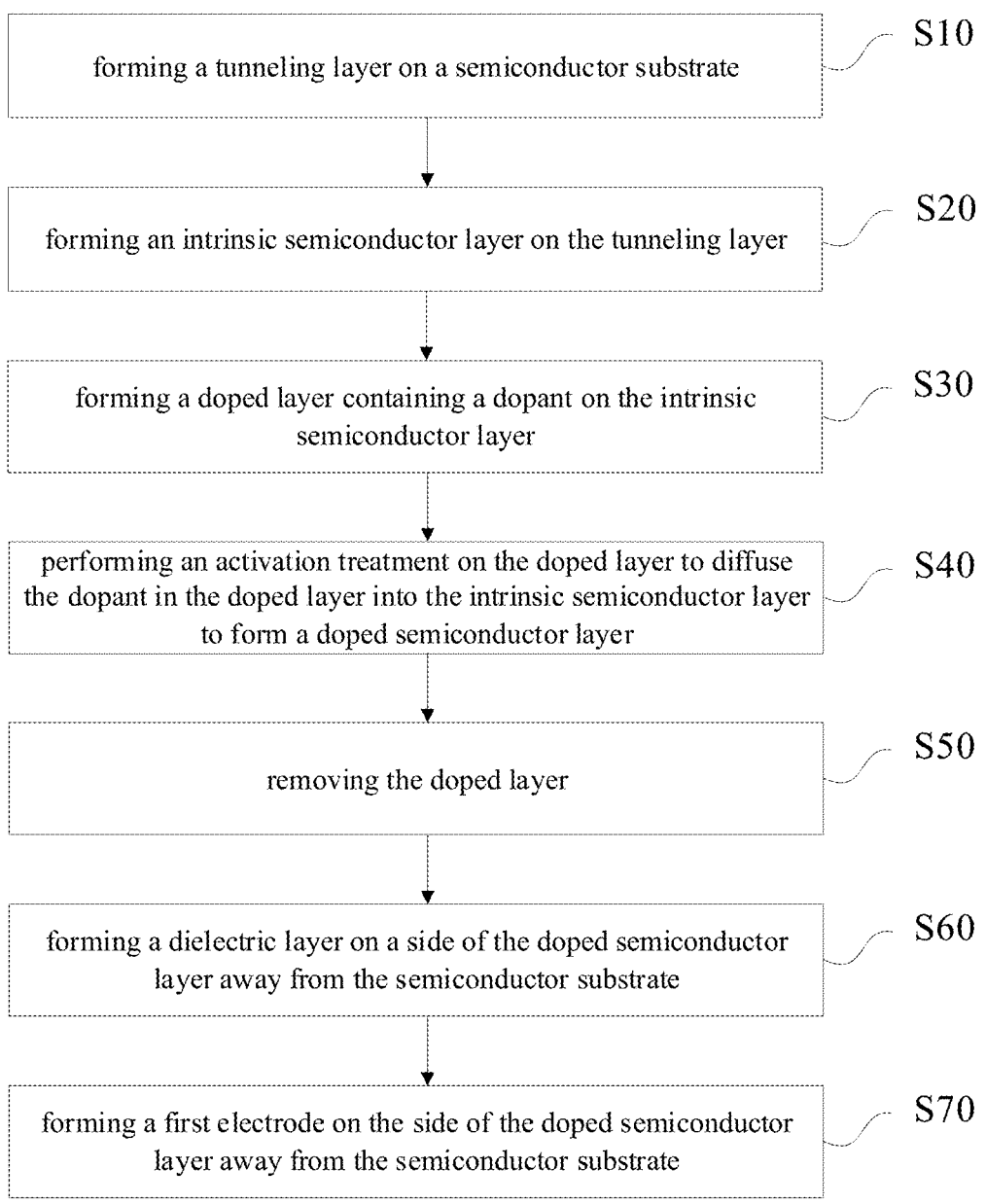

forming a tunneling layer on a semiconductor substrate — S10 forming an intrinsic semiconductor layer on the tunneling layer — S20 forming a doped layer containing a dopant on the intrinsic semiconductor layer — S30 performing an activation treatment on the doped layer to diffuse the dopant in the doped layer into the intrinsic semiconductor layer to form a doped semiconductor layer — S40 removing the doped layer — S50 forming a dielectric layer on a side of the doped semiconductor layer away from the semiconductor substrate — S60 forming a first electrode on the side of the doped semiconductor layer away from the semiconductor substrate — S70

FIG. 8

PASSIVATED CONTACT STRUCTURE AND PREPARATION METHOD THEREOF, AND SOLAR CELL AND PREPARATION METHOD THEREOF

CROSS-REFERENCE TO RELATED APPLICATIONS

This application claims priority to Chinese patent application No. 202311443751.6, filed on Nov. 1, 2023, the content of which is hereby incorporated by reference in its entirety.

TECHNICAL FIELD

The present disclosure relates to the field of solar cell technologies, and in particular, to a passivated contact structure and a preparation method thereof, and a solar cell and a preparation method thereof.

BACKGROUND

With the continuous development of solar cell technologies, people also have increasingly higher requirements for photoelectric conversion efficiency of cells. However, at present, improvement in efficiency of industrialized cells still faces many challenges. Contact recombination of metal and silicon contact region as well as auger recombinations and deep level recombinations caused by diffusion in a silicon substrate are main constraints on improvement in cell efficiency.

In order to reduce recombination rates, prolong a minority carrier lifetime, and improve photoelectric conversion efficiency of the cells, generally, the silicon substrate may be passivated. A passivated contact structure is formed on a surface of the silicon substrate to reduce recombinations of surface carriers to reduce effects of internal defects in the silicon substrate. How to further improve passivation performance of the passivated contact structure has become a research focus for those skilled in the art.

SUMMARY

According to various embodiments, a passivated contact structure and a preparation method thereof, and a solar cell and a preparation method thereof are provided.

In a first aspect, embodiments of the present disclosure provide a preparation method of a passivated contact structure, including: forming a tunneling layer on a semiconductor substrate;

forming an intrinsic semiconductor layer on the tunneling layer; forming a doped layer containing a dopant on the intrinsic semiconductor layer; and performing an activation treatment on the doped layer to diffuse the dopant in the doped layer into the intrinsic semiconductor layer to form a doped semiconductor layer; wherein the tunneling layer and the doped semiconductor layer form the passivated contact structure.

In an embodiment, the intrinsic semiconductor layer is formed by a plasma enhanced chemical vapor deposition (PECVD) process.

In an embodiment, a process gas of the PECVD process includes a silicon source gas and a diluent gas.

In an embodiment, a ratio of a flow rate of the diluent gas to a flow rate of the silicon source gas is greater than or equal to 1.5.

And/or, the silicon source gas includes at least one of $SiH_4$, $Si_2H_6$, $SiCl_3H$, and $SiH_2Cl_2$; And/or, the diluent gas includes at least one of $H_2$, Ar, $N_2$, He, and Xe.

In an embodiment, in the PECVD process, the process gas is excited using a microwave power supply or a radio frequency power supply.

Power of the power supply ranges from 6000 W to 15000 W, and/or, a frequency of the power supply ranges from 30 K to 250 K.

In an embodiment, a deposition rate of the intrinsic semiconductor layer ranges from 2 nm/min to 20 nm/min.

And/or, a chamber pressure during the PECVD process ranges from 500 m Torr to 5000 m Torr.

And/or, a chamber temperature during the PECVD process ranges from 350° C. to 480° C.

In an embodiment, the preparation method further includes, prior to the performing the activation treatment on the doped layer to diffuse the dopant in the doped layer into the intrinsic semiconductor layer to form the doped semiconductor layer: performing a first thermal treatment on the intrinsic semiconductor layer to control a crystalline fraction of the intrinsic semiconductor layer to be a first preset value.

In an embodiment, the first thermal treatment is performed before forming the doped layer, or the first thermal treatment is performed after forming the doped layer.

In an embodiment, a treatment temperature of the first thermal treatment ranges from 600° C. to 850° C., and a treatment time of the first thermal treatment is greater than or equal to 5 min.

And/or the first preset value is greater than or equal to 10%.

In an embodiment, a reaction gas is supplied into a reaction chamber, and the doped layer is formed at a first preset temperature.

In an embodiment, the reaction gas includes a doping source gas and oxygen.

And/or, the first preset temperature ranges from 700° C. to 850° C.

In an embodiment, in the performing the activation treatment on the doped layer to diffuse the dopant in the doped layer into the intrinsic semiconductor layer to form the doped semiconductor layer, a second thermal treatment is performed on the doped layer and the intrinsic semiconductor layer to activate the doped layer and control a crystalline fraction of the intrinsic semiconductor layer to be a second preset value.

In an embodiment, a treatment temperature of the second thermal treatment ranges from 850° C. to 1000° C., and a treatment time of the second thermal treatment ranges from 3 min to 90 min.

And/or, the second preset value is greater than or equal to 60%.

In an embodiment, the preparation method further includes: removing the doped layer.

In a second aspect, embodiments of the present disclosure provide a passivated contact structure. The passivated contact structure is prepared by the preparation method of the passivated contact structure according to any one of the embodiments in the first aspect.

In a third aspect, embodiments of the present disclosure provide a solar cell, including: a semiconductor substrate; the passivated contact structure in the second aspect, arranged on a side of the semiconductor substrate; a dielectric layer arranged on a side of the passivated contact structure away from the semiconductor substrate; and a first electrode, a first end of the first electrode extending through the dielectric layer and part of a doped semiconductor layer of the passivated contact structure and being electrically connected to the doped semiconductor layer, and a second end of the first electrode extending in a direction away from the semiconductor substrate.

In a fourth aspect, embodiments of the present disclosure provide a preparation method of a solar cell, including the preparation method of the solar cell according to any one of the embodiments in the first aspect.

In an embodiment, the preparation method of the solar cell further includes: forming a dielectric layer on a side of the doped semiconductor layer away from the semiconductor substrate; and forming a first electrode on the side of the doped semiconductor layer away from the semiconductor substrate, a first end of the first electrode extending through the dielectric layer and part of the doped semiconductor layer and being electrically connected to the doped semiconductor layer, and a second end of the first electrode extending in a direction away from the semiconductor substrate.

BRIEF DESCRIPTION OF THE DRAWINGS

In order to illustrate the technical solutions in the embodiments or exemplary embodiments of the present disclosure more clearly, the accompanying drawings to be used in the description of the embodiments or exemplary embodiments will be briefly introduced below.

Apparently, the accompanying drawings in the following description only illustrate some embodiments of the present disclosure. For those of ordinary skill in the art, other accompanying drawings can be obtained based on these accompanying drawings without creative efforts.

FIG. 1 is a schematic flowchart of a preparation method of a passivated contact structure according to an embodiment of the present disclosure.

FIG. 2 to FIG. 5 are schematic structural views during the preparation method shown in FIG. 1.

FIG. 8 is a schematic flowchart of a preparation method of a solar cell according to an embodiment of the present disclosure.

ILLUSTRATION FOR REFERENCE SIGNS

Figure 3:
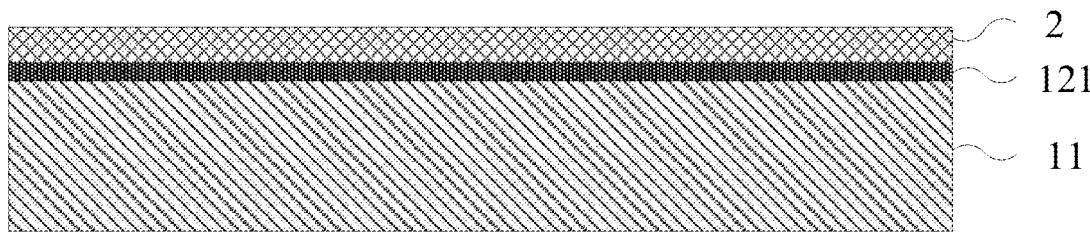
Figure 4:
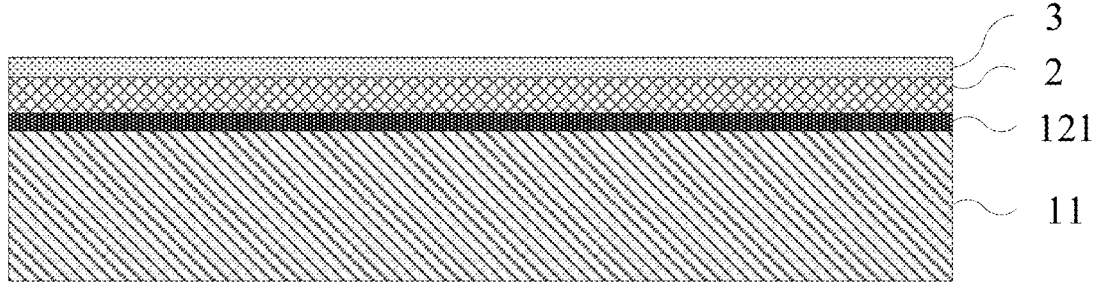

1: solar cell; 11: semiconductor substrate; 12: passivated contact structure; 121: tunneling layer; 122: doped semiconductor layer; 13: dielectric layer; 14: first electrode; 15: emitter; 16: highly doped region; 17: antireflection layer; 18: second electrode; 2: intrinsic semiconductor layer; 3: doped layer.

DETAILED DESCRIPTION

In order to make the above objects, features, and advantages of the present disclosure more obvious and understandable, specific implementations of the present disclosure are described in detail below with reference to the accompanying drawings. In the following description, many specific details are set forth in order to fully understand the present disclosure. However, the present disclosure can be implemented in many other manners different from those described herein, and those skilled in the art can make similar improvements without departing from the connotation of the present disclosure. Therefore, the present disclosure is not limited by the specific embodiments disclosed below.

Unless defined otherwise, all technical and scientific terms used herein have the same meanings as would generally understood by those skilled in the technical field to which the present disclosure belongs. The terms used herein in the specification of the present disclosure are for the purpose of describing specific embodiments only, and are not intended to limit the present disclosure.

It should be understood that when an element or layer is referred to as being "on", "adjacent to", "connected to", or "coupled to" another element or layer, the element or layer may be directly on, adjacent to, connected to, or coupled to the another element or layer, or an intermediate element or layer may be provided therebetween. On the contrary, when an element is referred to as being "directly on", "directly adjacent to", "directly connected to", or "directly coupled to" another element or layer, no intermediate element or layer may be provided therebetween. It should be understood that although terms such as first, second, and third may be used to describe various elements, components, regions, layers, doped types and/or portions, the elements, components, regions, layers, doped types and/or portions may not be limited by such terms. Such terms are used only to distinguish one element, component, region, layer, doped type, or portion from another element, component, region, layer, doped type, or portion. Thus, without departing from the teaching of the present disclosure, a first element, component, region, layer, doped type, or portion may be referred to as a second element, component, region, layer, or portion.

Spatial relationship terms such as "under", "underneath", "below", "beneath", "over", and "above" may be used for illustrative purposes to describe a relationship between one element or feature and another element or feature illustrated in the figures. It should be understood that, in addition to the orientations illustrated in the figures, the spatial relationship terms are intended to further include different orientations of the device in use and operation. For example, if the device in the figures is flipped over, the element or feature described as "below", "underneath" or "under" another element or feature may be oriented as "above" the another element or feature. Thus, the exemplary terms "below" and "under" may include two orientations of above and below. In addition, the device may be orientated in other ways (e.g., rotated by 90-degree or otherwise orientated), and thus spatial descriptors used herein may be interpreted accordingly.

In use, the singular forms of "a/an", "one", and "the" may also include plural forms, unless otherwise clearly specified by the context. It should be further understood that the terms "include/comprise", "have" and/or like specify the presence of the features, integers, steps, operations, components, portions, or combinations thereof, but may not exclude the presence or addition of one or more other features, integers, steps, operations, components, portions, or combinations thereof. In addition, in the specification, the term "and/or" may include any and all combinations of associated listed items.

Embodiments of the present disclosure are described herein with reference to schematic cross-sectional views of ideal embodiments (and intermediate structures) of the present disclosure. In this way, variations of the illustrated shape caused by, for example, manufacturing techniques and/or tolerances, may be expected. Thus, the embodiments of the present disclosure may not be limited to the specific shapes of the regions illustrated herein, but may include shape deviations caused by, for example, the manufacturing techniques. For example, an implanted region illustrated as rectangular in shape, typically, has rounded or curved features and/or a gradient of implantation concentration at its edges rather than a binary change from an implanted region to a non-implanted region. Likewise, a buried region formed by implantation may result in some implantation in the region between the buried region and a surface being passed through during the implantation. Thus, the region shown in the drawings is generally illustrative, and the illustrated shape is not intended to show the actual shape of the region of the device, and is not intended to limit the scope of the present disclosure.

In a first aspect, referring to FIG. 1 together with FIGS. 2 to 5, embodiments of the present disclosure provide a preparation method of a passivated contact structure, specifically including the following steps of S100 to S400.

At S100, a tunneling layer 121 is formed on a semiconductor substrate 11. In an example, the tunneling layer 121 is formed on a back surface of the semiconductor substrate 11. Exemplarily, the tunneling layer 121 may be made of a dielectric material, such as silicon oxide, aluminum oxide, silicon nitride, silicon oxynitride, magnesium fluoride, amorphous silicon, polysilicon, silicon carbide, or titanium oxide. It may be understood that the tunneling layer 121 may be prepared by a process such as atomic layer deposition (ALD), plasma enhanced chemical vapor deposition (PECVD), or plasma enhanced atomic layer deposition (PEALD).

At S200, an intrinsic semiconductor layer 2 is formed on the tunneling layer 121. In an example, the intrinsic semiconductor layer 2 is an amorphous intrinsic semiconductor. Further, the intrinsic semiconductor layer 2 may be an intrinsic amorphous silicon layer.

Specifically, the intrinsic semiconductor layer 2 may be prepared by a chemical vapor deposition (CVD) process.

At S300, a doped layer 3 containing a dopant is formed on the intrinsic semiconductor layer 2. It may be understood that the dopant may be an N-type dopant or a P-type dopant.

Specifically, the doped layer 3 may be prepared by a process such as PECVD, spin coating, or printing.

At S400, an activation treatment is performed on the doped layer 3 to diffuse the dopant in the doped layer 3 into the intrinsic semiconductor layer 2 to form a doped semiconductor layer 122. The tunneling layer 121 and the doped semiconductor layer 122 form the passivated contact structure 12.

The activation treatment may be thermal treatment. For example, the thermal treatment is performed on the doped layer 3 under a nitrogen atmosphere to activate the dopant in the doped layer 3. After the dopant is activated, the dopant diffuses into the intrinsic semiconductor layer 2, so that the intrinsic semiconductor layer 2 becomes the doped semiconductor layer 122.

In the preparation method of the passivated contact structure according to the embodiments of the present disclosure, the intrinsic semiconductor layer 2 undoped is firstly formed, then the doped layer 3 containing the dopant is formed, and then the doped layer 3 is activated to form the doped semiconductor layer 122. In this way, firstly, compared with an in-situ doping manner, a deposition rate of the intrinsic semiconductor layer 2 in the embodiments of present disclosure is faster, which helps improve productivity, and composition of the process gas is simpler than that of the process gas in the in-situ doping, enabling a more uniform film thickness of the intrinsic semiconductor layer 2. Secondly, through the arrangement of the doped layer 3 containing the dopant on the intrinsic semiconductor layer 2, the dopant can be sufficiently provided to effectively fill pores due to grain boundary defects and achieve higher concentration doping, thereby achieving a better field passivation effect. Thirdly, compared with the in-situ doping, the dopant enters the intrinsic semiconductor layer 2 via a surface thereof, and causes less damage to the tunneling layer 121 during the diffusion due to a cushioning effect of the intrinsic semiconductor layer 2, resulting in lower pinhole density, thereby enabling a better passivation performance.

In an embodiment, the intrinsic semiconductor layer 2 is formed by a PECVD process. In this way, deposition may be performed at a lower temperature on the one hand, and the deposition rate can be increased on the other hand, which helps improve productivity.

In an embodiment, a process gas of the PECVD process includes a silicon source gas and a diluent gas. In this way, the silicon source gas may be excited to discharge and ionized to generate plasma, which is deposited on the tunneling layer 121. The diluent gas may dilute the silicon source gas to improve uniformity and maintain pressure in a tube.

In an embodiment, a ratio of a flow rate of the diluent gas to a flow rate of the silicon source gas is greater than or equal to 1.5.

In a specific embodiment, the ratio of the flow rate of the diluent gas to the flow rate of the silicon source gas ranges from 1.5 to 4. Exemplarily, the ratio of the flow rate of the diluent gas to the flow rate of the silicon source gas may be 1.5:1, 2:1, 3:1, or 4:1.

The ratio of the flow rate of the diluent gas to the flow rate of the silicon source gas being within the above range can enable a better uniformity of the film thickness.

It is to be noted that gas flow rates of the diluent gas and the silicon source gas are associated with a size of the reactor furnace tube. The gas flow rates of the diluent gas and the silicon source gas are not limited in the embodiments of the present disclosure.

In an embodiment, the silicon source gas includes at least one of $SiH_4$, $Si_2H_6$, $SiCl_3H$, and $SiH_2Cl_2$.

In an embodiment, the diluent gas includes at least one of $H_2$, Ar, $N_2$, He, and Xe.

It is to be noted that inert gases such as Ar, $N_2$, He, and Xe may dilute the silicon source gas to improve uniformity and maintain the pressure in the tube. $H_2$ can dilute the silicon source gas to improve uniformity and maintain the pressure in the tube, and can also be ionized to provide hydrogen ions to improve passivation. In an example, the diluent gas includes $H_2$ and Ar.

In an embodiment, in the PECVD process, the process gas is excited using a microwave power supply or a radio frequency power supply.

In an example, power of the microwave power supply or the radio frequency power supply ranges from 6000 W to 15000 W. Exemplarily, the power of the microwave power supply or the radio frequency power supply may be 6000 W, 8000 W, 9000 W, 11000 W, 12000 W, 13000 W, or 15000 W.

In a preferred example, the power of the microwave power supply or the radio frequency power supply ranges from 9000 W to 12000 W.

In an example, a frequency of the microwave power supply or the radio frequency power supply ranges from 30 K to 250 K. Exemplarily, the frequency of the microwave power supply or the radio frequency power supply may be 30 K, 40 K, 50 K, 90 K, 100 K, 150 K, 170 K, 190 K, 210 K, 230 K, or 250 K.

In a preferred example, the frequency of the microwave power supply or the radio frequency power supply ranges from 40 K to 100 K.

The power and the frequency of the microwave power supply or the radio frequency power supply being within the above ranges can fully excite the process gas to generate glow discharge.

It is to be noted that the process gas may alternatively be excited to generate glow discharge by using a direct current (DC) high voltage or pulse discharge. The method of exciting the process gas to generate glow discharge is not limited in the embodiments of the present disclosure.

In an embodiment, a deposition rate of the intrinsic semiconductor layer 2 ranges from 2 nm/min to 20 nm/min. Exemplarily, the deposition rate may be 2 nm/min, 3 nm/min, 5 nm/min, 8 nm/min, 10 nm/min, 14 nm/min, 16 nm/min, 19 nm/min, or 20 nm/min.

In a preferred example, the deposition rate of the intrinsic semiconductor layer 2 ranges from 3 nm/min to 10 nm/min.

The deposition rate being within the above range can not only ensure quality of film formation, and but also help improve productivity.

In an embodiment, chamber pressure in a reaction chamber during the PECVD process ranges from 500 m Torr to 5000 m Torr. Exemplarily, the chamber pressure may be 500 m Torr, 1000 m Torr, 1500 m Torr, 2000 m Torr, 2500 m Torr, 3000 mTorr, 3500 m Torr, 4100 m Torr, 4600 m Torr, or 5000 m Torr.

In a preferred example, the chamber pressure ranges from 1000 m Torr to 3500 m Torr.

The chamber pressure being within the above range can keep the deposition rate within a controllable range and enable a better uniformity of a film layer.

In an embodiment, a chamber temperature in the reaction chamber during the PECVD process ranges from 350° C. to 480° C. Exemplarily, the chamber temperature may be 350° C., 380° C., 400° C., 410° C., 430° C., 450° C., 470° C., or 480° C.

The chamber temperature being within the above range can keep the deposition rate within a controllable range and enable a better uniformity of the film layer.

In an embodiment, prior to S400, the preparation method further includes the following step S350.

At S350, a first thermal treatment is performed on the intrinsic semiconductor layer 2 to control a crystalline fraction of the intrinsic semiconductor layer 2 to be a first preset value.

The crystallization of part of intrinsic semiconductor layer 2 can be achieved by thermally treating the intrinsic semiconductor layer 2 before doping, which can effectively reduce defect state density of the intrinsic semiconductor layer 2 and help achieve effective higher-concentration doping, thereby providing a better field passivation effect.

In an example, the first thermal treatment is performed before the doped layer 3 is formed, that is, the first thermal treatment is performed subsequent to S200 and prior to S300. In this way, after the defect state density of the intrinsic semiconductor layer 2 is reduced, the doped layer 3 is deposited, which helps achieve effective higher-concentration doping.

In another example, the first thermal treatment is performed after the doped layer 3 is formed, that is, the first thermal treatment is performed subsequent to S300 and prior to S400. In this way, the first thermal treatment and the activation treatment can be performed sequentially in a same tube, and after the first thermal treatment is completed, the activation treatment can be performed directly without cooling down, thereby saving process time.

In an embodiment, a treatment temperature of the first thermal treatment ranges from 600° C. to 850° C. Exemplarily, the treatment temperature of the first thermal treatment may be 600° C., 650° C., 710° C., 750° C., 800° C., or 850° C. Treatment time of the first thermal treatment is greater than or equal to 5 min. Exemplarily, the treatment time of the first thermal treatment may be 5 min, 8 min, 10 min, 15 min, or 20 min.

In an embodiment, the first preset value is greater than or equal to 10%. That is, after the first thermal treatment, the crystalline fraction of the intrinsic semiconductor layer 2 is greater than 10%. In this way, it is beneficial to reduce the defect state density of the intrinsic semiconductor layer 2. It may be understood that the crystalline fraction of the intrinsic semiconductor layer 2 may be measured by Raman spectroscopy, X-ray diffraction, or the like.

In an embodiment, when the doped layer 3 is prepared, a reaction gas is supplied into the reaction chamber, and then the doped layer 3 is formed at a first preset temperature. In this way, during the preparation of the doped layer 3, the intrinsic semiconductor layer 2 is simultaneously thermally treated to reduce the defect state density of the intrinsic semiconductor layer 2. In this way, the process time can be saved.

In an embodiment, the reaction gas includes a doping source gas and oxygen. Exemplarily, the doping source gas may be a phosphorus-containing gas or a boron-containing gas. For example, the phosphorus-containing gas may be phosphane, and the boron-containing gas may be borane.

In an example, the first preset temperature ranges from 700° C. to 850° C. Exemplarily, the first preset temperature may be 700° C., 730° C., 750° C., 770° C., 800° C., or 850° C.

In an embodiment, at S400, a second thermal treatment is performed on the doped layer 3 and the intrinsic semiconductor layer 2 to activate the doped layer 3 and control the crystalline fraction of the intrinsic semiconductor layer 2 to be a second preset value.

In this way, the second thermal treatment has at least the following functions: to activate the dopant to diffuse the dopant into the intrinsic semiconductor layer 2 so that the intrinsic semiconductor layer 2 becomes the doped semiconductor layer 122; and to achieve a higher degree of crystallization of an intrinsic semiconductor and to improve efficiency and stability of a solar cell 1.

In an embodiment, a treatment temperature of the second thermal treatment ranges from 850° C. to 1000° C. Exemplarily, the treatment temperature of the second thermal treatment may be 850° C., 900° C., 930° C., 950° C., 980° C., or 1000° C.

In a preferred example, the treatment temperature of the second thermal treatment ranges from 900° C. to 950° C.

The treatment temperature of the second thermal treatment being in the above range helps achieve effective higher-concentration doping on the one hand, and helps achieve a higher crystalline fraction on the other hand.

In an embodiment, treatment time of the second thermal treatment ranges from 3 min to 9 min. Exemplarily, the treatment time of the second thermal treatment may be 3 min, 10 min, 15 min, 20 min, 30 min, 50 min, 60 min, 68 min, 75 min, 80 min, or 90 min.

In a preferred example, the treatment time of the second thermal treatment ranges from 10 min to 50 min.

The treatment time of the second thermal treatment being in the above range helps achieve effective higher-concentration doping on the one hand, and helps achieve a higher crystalline fraction on the other hand.

In an embodiment, the second preset value is greater than or equal to 60%. That is, after the second thermal treatment, the crystalline fraction of the intrinsic semiconductor layer 2 is greater than 60%. In this way, a higher degree of crystallization of the intrinsic semiconductor can achieved, and efficiency and stability of the solar cell 1 can be improved.

In an embodiment, the preparation method of the passivated contact structure further includes the following step S500.

At S500, the doped layer 3 is removed. Exemplarily, the doped layer 3 may be removed by a washing agent.

In an embodiment, the tunneling layer 121 is made of silicon oxide. The tunneling layer 121 made of silicon oxide may be prepared by a PECVD process. Specifically, the chamber temperature in the reaction chamber ranges from 300° C. to 500° C., and the process gas is nitrous oxide. Under the microwave power supply, oxygen ions generated by ionization are combined with silicon to form silicon oxide. Exemplarily, a thickness of silicon oxide ranges from 0.6 nm to 2 nm. In this way, the tunneling layer 121 can be deposited at a low temperature, so that the deposition rate is low, and the film thickness and the uniformity of the tunneling layer 121 can be easily controlled, which helps improve the quality of film formation.

It may be understood that the tunneling layer 121 may alternatively be prepared by a thermal oxidation process, such as dry oxidation or wet oxidation.

Figure 5:
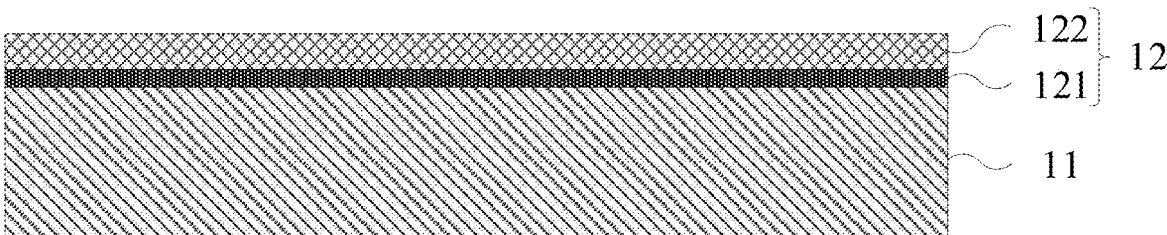

In a second aspect, referring to FIG. 5, embodiments of the present disclosure provide a passivated contact structure 12. The passivated contact structure 12 is prepared by the preparation method of the passivated contact structure according to any one of the embodiments in the first aspect. The passivated contact structure 12 may be applied to tunnel oxide passivated contact (TOPCon) cells or Interdigitated Back Contact (IBC) solar cells.

Figure 6:
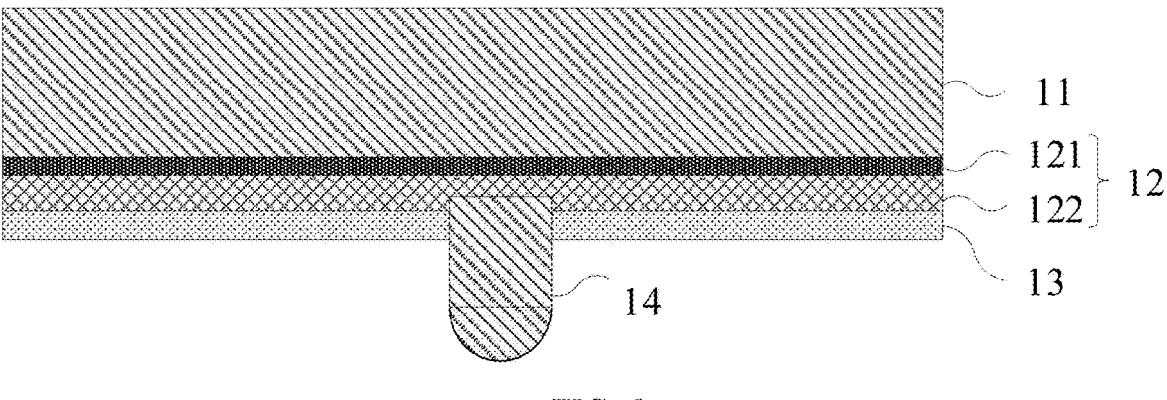
FIG. 6 is a schematic view of a passivated contact structure shown in FIG. 5 and a first electrode.

In a third aspect, referring to FIG. 6, embodiments of the present disclosure provide a solar cell 1. The solar cell 1 includes: a semiconductor substrate 11, the passivated contact structure 12 in the second aspect, a dielectric layer 13, and a first electrode 14.

The passivated contact structure 12 is arranged on a side of the semiconductor substrate 11. Exemplarily, the passivated contact structure 12 may be located on a back surface of the semiconductor substrate 11. The dielectric layer 13 is arranged on a side of the passivated contact structure 12 away from the semiconductor substrate 11. A first end of the first electrode 14 extends through the dielectric layer 13 and part of a doped semiconductor layer 122 of the passivated contact structure 12, and is electrically connected to the doped semiconductor layer 122, and a second end of the first electrode 14 extends in a direction away from the semiconductor substrate 11. Exemplarily, the first electrode 14 may be a back electrode.

It may be understood that, when one end of the first electrode 14 extends through the dielectric layer 13 and extends into the passivated contact structure 12, an area of connection between the first electrode 14 and the passivated contact structure 12 may be larger, and an electrical connection effect may be better.

Figure 7:
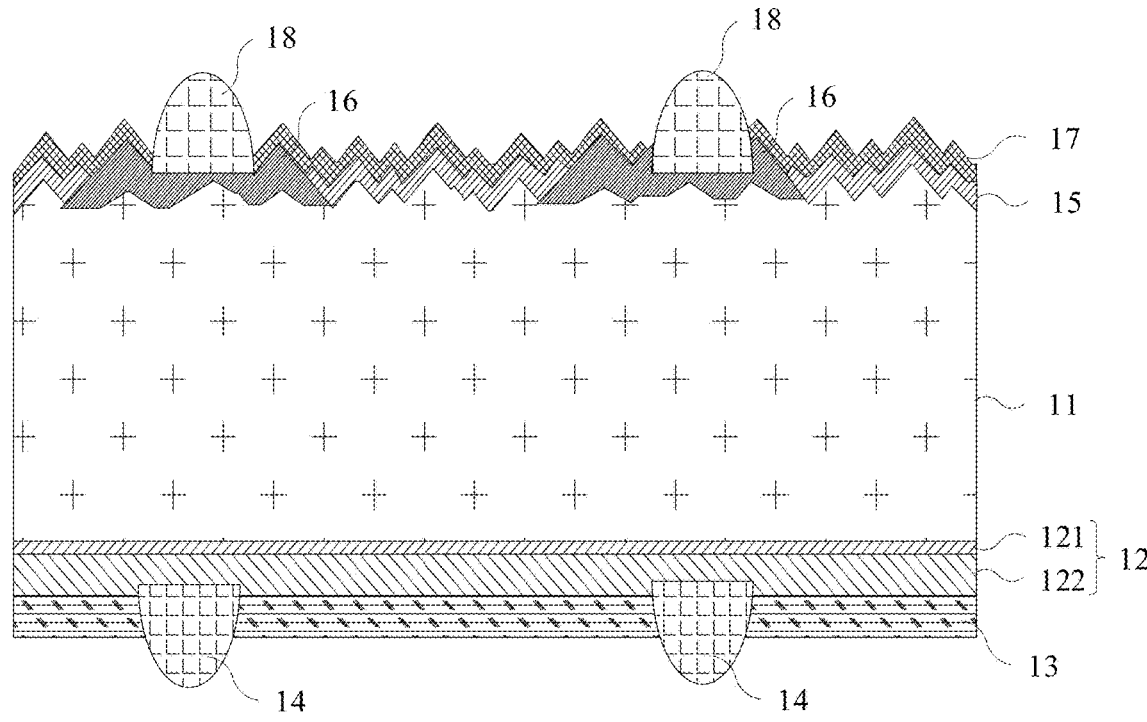
FIG. 7 is a schematic cross-sectional view of a solar cell according to an embodiment of the present disclosure.

In an embodiment, referring to FIG. 7, the solar cell 1 further includes an emitter 15, an antireflection layer 17, and a second electrode 18. The emitter 15 and the antireflection layer 17 are sequentially stacked on a front surface of the semiconductor substrate 11. The emitter 15 is provided with a highly doped region 16. The second electrode 18 is electrically connected to the highly doped region 16.

In a fourth aspect, referring to FIG. 8, embodiments of the present disclosure provide a preparation method of a solar cell, including the preparation method of the passivated contact structure according to any one of the embodiments in the first aspect.

In an example, the preparation method of the solar cell includes the following steps of S10 to S50.

At S10, a tunneling layer 121 is formed on a semiconductor substrate 11.

At S20, an intrinsic semiconductor layer 2 is formed on the tunneling layer 121.

At S30, a doped layer 3 containing a dopant is formed on the intrinsic semiconductor layer 2.

At S40, an activation treatment is performed on the doped layer 3 to diffuse the dopant in the doped layer 3 into the intrinsic semiconductor layer 2 to form a doped semiconductor layer 122.

At S50, the doped layer 3 is removed.

In the preparation method of the solar cell according to the embodiments of the present disclosure, the intrinsic semiconductor layer 2 undoped is firstly formed, then the doped layer 3 containing the dopant is formed, and then the doped layer 3 is activated to form the doped semiconductor layer 122. In this way, firstly, compared with an in-situ doping manner, a deposition rate of the intrinsic semiconductor layer 2 in the embodiments of present disclosure is faster, which helps improve productivity, and composition of the process gas is simpler than that of the process gas in the in-situ doping, enabling a more uniform film thickness of the intrinsic semiconductor layer 2. Secondly, through the arrangement of the doped layer 3 containing the dopant on the intrinsic semiconductor layer 2, the dopant can be sufficiently provided to effectively fill pores due to grain boundary defects and achieve higher concentration doping, thereby achieving a better field passivation effect. Thirdly, compared with the in-situ doping, the dopant enters the intrinsic semiconductor layer 2 via a surface thereof, and causes less damage to the tunneling layer 121 during the diffusion due to a cushioning effect of the intrinsic semiconductor layer 2, resulting in lower pinhole density, thereby enabling a better passivation performance.

In an embodiment, referring to FIG. 8 the preparation method of the solar cell further includes the following steps S60 to S70.

At S60, a dielectric layer 13 is formed on a side of the doped semiconductor layer 122 away from the semiconductor substrate 11. Exemplarily, the dielectric layer 13 may be made of a dielectric material, such as silicon oxide, aluminum oxide, silicon nitride, silicon oxynitride, magnesium fluoride, amorphous silicon, polysilicon, silicon carbide, or titanium oxide. It may be understood that the dielectric layer 13 may be prepared by a process such as ALD, PECVD, or PEALD.

At S70, a first electrode 14 is formed on the side of the doped semiconductor layer 122 away from the semiconductor substrate 11. A first end of the first electrode 14 extends through the dielectric layer 13 and part of the doped semiconductor layer 122, and is electrically connected to the doped semiconductor layer 122, and a second end of the first electrode 14 extends in a direction away from the semiconductor substrate 11. Exemplarily, the first electrode 14 may be prepared by a process such as screen printing, evaporation, or electroplating.

It should be understood that, in the embodiments of the present disclosure, at least part of the steps in the drawings may include a plurality of steps or a plurality of stages. These steps or stages are not necessarily performed at the same time, but may be performed at different times. These steps or stages may not be necessarily performed in sequence, but may be performed alternately with other steps or alternately with at least part of the steps or stages of other steps.

The technical features of the above-mentioned embodiments can be combined arbitrarily. In order to make the description concise, not all possible combinations of the technical features are described in the embodiments. However, as long as there is no contradiction in the combination of these technical features, the combinations should be considered as in the scope of the specification.

The above-described embodiments are only several implementations of the present disclosure, and the descriptions are relatively specific and detailed, but they should not be construed as limiting the scope of the present disclosure. It should be understood by those of ordinary skill in the art that various modifications and improvements can be made without departing from the concept of the present disclosure, and all fall within the protection scope of the present disclosure. Therefore, the patent protection of the present disclosure shall be defined by the appended claims.

The invention claimed is:

1. A preparation method of a passivated contact structure, comprising:

forming a tunneling layer on a semiconductor substrate;

forming an intrinsic semiconductor layer on the tunneling layer;

forming a doped layer containing a dopant on the intrinsic semiconductor layer; and performing an activation treatment on the doped layer to diffuse the dopant in the doped layer into the intrinsic semiconductor layer to form a doped semiconductor layer;

wherein the tunneling layer and the doped semiconductor layer form the passivated contact structure, and wherein a first thermal treatment is performed subsequent to forming the intrinsic semiconductor layer and prior to forming the doped layer, thereby reducing the defect state density of the intrinsic semiconductor layer to help achieve effective higher-concentration doping, thereby providing a better field passivation effect.

2. The preparation method according to claim 1, wherein the intrinsic semiconductor layer is formed by a plasma enhanced chemical vapor deposition (PECVD) process.

3. The preparation method according to claim 2, wherein a process gas of the PECVD process comprises a silicon source gas and a diluent gas.

4. The preparation method according to claim 3, wherein a ratio of a flow rate of the diluent gas to a flow rate of the silicon source gas is greater than or equal to 1.5;

and/or, the silicon source gas comprises at least one of $SiH_4$, $Si_2H_6$, $SiCl_3H$, and $SiH_2Cl_2$;

and/or, the diluent gas comprises at least one of $H_2$, Ar, $N_2$, He, and Xe.

5. The preparation method according to claim 2, wherein, in the PECVD process, the process gas is excited using a microwave power supply or a radio frequency power supply; and power of the power supply ranges from 6000 W to 15000 W, and/or, a frequency of the power supply ranges from 30 KHz to 250 KHz.

6. The preparation method according to claim 2, wherein a deposition rate of the intrinsic semiconductor layer ranges from 2 nm/min to 20 nm/min;

and/or, a chamber pressure during the PECVD process ranges from 500 mTorr to 5000 mTorr;

and/or, a chamber temperature during the PECVD process ranges from 350° C. to 480° C.

7. The preparation method according to claim 1, wherein the first thermal treatment is performed on the intrinsic semiconductor layer to control a crystalline fraction of the intrinsic semiconductor layer to be a first preset value.

8. The preparation method according to claim 7, wherein a treatment temperature of the first thermal treatment ranges from 600° C. to 850° C., and a treatment time of the first thermal treatment is greater than or equal to 5 min;

and/or, the first preset value is greater than or equal to 10%.

9. The preparation method according to claim 1, wherein a reaction gas is supplied into a reaction chamber, and the doped layer is formed at a first preset temperature.

10. The preparation method according to claim 9, wherein the reaction gas comprises a doping source gas and oxygen;

and/or, the first preset temperature ranges from 700° C. to 850° C.

11. The preparation method according to claim 1, wherein, in the performing the activation treatment on the doped layer to diffuse the dopant in the doped layer into the intrinsic semiconductor layer to form the doped semiconductor layer, a second thermal treatment is performed on the doped layer and the intrinsic semiconductor layer to activate the doped layer and control a crystalline fraction of the intrinsic semiconductor layer to be a second preset value.

12. The preparation method according to claim 11, wherein a treatment temperature of the second thermal treatment ranges from 850° C. to 1000° C., and a treatment time of the second thermal treatment ranges from 3 min to 90 min;

and/or, the second preset value is greater than or equal to 60%.

13. The preparation method according to claim 1, further comprising:

removing the doped layer.

14. A preparation method of a solar cell, comprising the preparation method of the passivated contact structure according to claim 1.

15. The preparation method according to claim 14, further comprising:

forming a dielectric layer on a side of the doped semiconductor layer away from the semiconductor substrate; and forming a first electrode on the side of the doped semiconductor layer away from the semiconductor substrate, a first end of the first electrode extending through the dielectric layer and part of the doped semiconductor layer and being electrically connected to the doped semiconductor layer, and a second end of the first electrode extending in a direction away from the semiconductor substrate.

* * * * *